(12) United States Patent
Menard et al.

(10) Patent No.: US 8,894,754 B2
(45) Date of Patent: Nov. 25, 2014

(54) BREATHING AND DESICCANT REGENERATING CYCLE FOR REDUCING CONDENSATION IN CONCENTRATOR PHOTOVOLTAIC MODULES

(75) Inventors: Etienne Menard, Durham, NC (US); Scott Burroughs, Durham, NC (US)

(73) Assignee: Semprius, Inc., Durham, NC (US)

( * ) Notice: Subject to any disclaimer, the term of this patent is extended or adjusted under 35 U.S.C. 154(b) by 1 day.

(21) Appl. No.: 13/571,972

(22) Filed: Aug. 10, 2012

(65) Prior Publication Data

US 2013/0036909 A1    Feb. 14, 2013

Related U.S. Application Data

(60) Provisional application No. 61/521,967, filed on Aug. 10, 2011.

(51) Int. Cl.
*B01D 53/02* (2006.01)
*H01L 31/052* (2014.01)
*B01D 53/26* (2006.01)

(52) U.S. Cl.
CPC ............ *H01L 31/0522* (2013.01); *Y02E 10/52* (2013.01); *B01D 53/261* (2013.01); *B01D 53/265* (2013.01)
USPC .................... 96/146; 95/91; 95/148; 136/248; 136/259

(58) Field of Classification Search
CPC .............. B01D 53/261; B01D 53/265; H01L 31/0522; Y02E 10/52

USPC ................. 95/91, 148; 96/146; 136/248, 259
See application file for complete search history.

(56) References Cited

U.S. PATENT DOCUMENTS

| | | |
|---|---|---|
| 2009/0173376 A1 | 7/2009 | Spencer et al. |
| 2009/0272428 A1* | 11/2009 | Jansen et al. ............ 136/251 |
| 2012/0097212 A1* | 4/2012 | McCoy et al. ............ 136/246 |
| 2012/0302685 A1* | 11/2012 | Ward et al. .............. 524/262 |

OTHER PUBLICATIONS

J. Sun et al., International Journal of Heat and Mass Transfer 48, 2005, pp. 4953-4962.

* cited by examiner

*Primary Examiner* — Christopher P Jones
(74) *Attorney, Agent, or Firm* — Myers Bigel Sibley & Sajovec, PA

(57) ABSTRACT

A concentrator photovoltaic apparatus for controlling internal condensation includes a light receiving module including one or more photovoltaic cells in a waterproof enclosure, at least one primary lens sealed to the waterproof enclosure for concentrating sunlight, a waterproof breather membrane regulating the pressure of the air located inside the enclosure, and a regenerative desiccant in a thermally decoupled dryer tube or thermally coupled to an internal surface of the enclosure. Smaller breather membrane vents and/or positive time delays between the temperature of the desiccant and the temperature of the enclosure may prolong an adsorption phase of the desiccant, which may substantially contribute to efficiency, reliability, and autonomous control of condensation.

26 Claims, 9 Drawing Sheets

BREATHING AND DESICCANT REGENERATING CYCLE FOR REDUCING CONDENSATION IN CONCENTRATOR PHOTOVOLTAIC MODULES

CLAIM OF PRIORITY

This application claims priority under 35 U.S.C. §119 to U.S. Provisional Patent Application Ser. No. 61/521,967, filed Aug. 10, 2011, the disclosure of which is hereby incorporated by reference herein.

FIELD

This invention is in the general field of solar power generation, and, more specifically, relates to concentrator photovoltaic modules that contain an internal cavity.

BACKGROUND

With the advent of concentrator photovoltaic (CPV) modules including micro miniature photocells and solar concentrator lenses, even minute amounts or specks of condensation between the lenses and photocells can degrade the output of the cells of the CPV modules. Such CPV modules are typically sealed, but may not be hermetically sealed, for example, due to cost considerations. Moisture droplets from condensation can act as tiny lenses and can redirect incident light that would otherwise be precisely focused on the photocells. Moisture and condensation also often leave residues and affect the functionality of the electronics in CPV modules by forming conductive paths in conjunction with other material in the modules. Furthermore, over time, the moisture can create corrosion between dissimilar metals inside the module and deteriorate module performance. When such events occur in solar arrays including a large number of modules, the damage to such arrays can be extensive and/or costly. With some solar arrays including thousands of sealed modules, remedial access to each module is typically impractical and/or prohibitive.

Some traditional approaches for controlling condensation include single-use or regenerative desiccant materials in various industries for protecting consumer goods or products, such as enclosures containing moisture sensitive electronic devices. For example, some regenerative air dryer systems are designed for drying compressed air, and rely on the use of two chambers filled with desiccant. Typically, when one of the chambers is in operation, the second chamber is regenerated using heaters or pressure swing adsorption. The complexity, cost and maintenance of these systems may limit their applicability for drying the air enclosed in concentrator photovoltaic modules. Similar single and multi-desiccant chamber systems, commonly referred to as desiccant beds, are also used for applications in refining petrochemical, chemical, and gas processing industries to extract water or other classes of molecules.

A different class of air dryer systems, which rely on the use of regenerative desiccant wheels, has been developed for regulating air humidity and/or to reduce energy needs for cooling air inside commercial and residential buildings. Some of these systems rely on the use of waste-heat or solar heat collectors as an energy source to regenerate a rotating desiccant wheel. However, the complexity, cost and maintenance of these systems may likewise limit their applicability for drying the air enclosed in concentrator photovoltaic modules.

Another approach for controlling moisture in a solar collector is described in U.S. Patent Application Publication No. 2009/0173376. In particular, this approach provides a first chamber including a solar collector and a second chamber including a desiccant, where the two chambers are thermally coupled and separated by a moisture barrier. The increase of the air temperature within the solar collector chamber during sun exposure induces a pressure increase within the chamber, pushing air through the desiccant chamber and out to the ambient. Conversely, the decrease of the air temperature within the solar collector at sunset (or multiple times during a cloudy day) induces a decrease of the pressure within the solar cell chamber, which pulls ambient air through the desiccant bed and then back into the solar collector chamber. While this approach provides a symmetrical cycle between the desiccant desorption and adsorption phases, it may not be effective in extracting water from within the solar collector chamber should condensation occur.

SUMMARY

Some embodiments of the present invention provide CPV modules including one or more concentrator photovoltaic modules having an internal air cavity that is sealed to prevent ingress of particles and liquids, desiccant beads configured to be regenerated using lost solar heat energy, and a breathable moisture barrier (also referred to herein as a water-proof breather) that enables air exchange between the internal air cavity and ambient air. In some embodiments, the desiccant beads may be located inside a heater tube that is configured to convert solar light into heat, which provides a way to at least partially regenerate the desiccant beads. Each module or small array of modules may be pneumatically connected to one side of the heater tube. The other side of the heater tube may be connected to ambient air through the water-proof breather. In further embodiments, the desiccant beads may be placed inside the module and may be in thermal contact with a surface of the module enclosure to permit at least partial regeneration of the desiccant beads upon sun exposure. Each module may be equipped with a waterproof breather that prevents liquid water from leaking inside the module. The breathers may have a relatively low vapor transmission rate in order to limit ingress of moist air when the ambient air relative humidity is relatively high.

According to some embodiments of the present invention, a concentrator-type photovoltaic apparatus includes a light receiving module enclosure comprising an internal cavity including one or more photovoltaic cells therein, a breathable moisture barrier configured to allow air exchange between the internal cavity and ambient air outside the module enclosure, and a desiccant chamber including a desiccant therein pneumatically coupled in series between the breathable moisture barrier and the internal cavity. The desiccant chamber is thermally decoupled from the module enclosure to provide a lag between a temperature of the desiccant chamber and a temperature of the internal cavity as the temperature of the internal cavity changes.

In some embodiments, the desiccant chamber and the module enclosure may be positioned such that the desiccant within the desiccant chamber is cooled prior to air inside the internal cavity of the module enclosure during a temperature cycle in which the temperature of the internal cavity decreases.

In some embodiments, the desiccant chamber is positioned under the module enclosure when mounted on a solar tracker.

In some embodiments, the desiccant chamber and the module enclosure may be positioned such that the desiccant within the desiccant chamber is heated prior to the air inside the internal cavity of the module enclosure during a temperature cycle in which the temperature of the internal cavity increases.

In some embodiments, the apparatus may further include a heat collector thermally coupled to the desiccant chamber.

In some embodiments, the heat collector may be configured absorb or concentrate incident solar radiation on the desiccant chamber to heat the desiccant at a higher rate than the air inside the internal cavity of the module enclosure during the temperature cycle in which the temperature of the internal cavity increases.

In some embodiments, the heat collector may be configured to dissipate heat accumulated in the desiccant chamber to cool the desiccant at a higher rate than the air inside the internal cavity of the module enclosure during the temperature cycle in which the temperature of the internal cavity decreases.

In some embodiments, the heat collector may physically contact the desiccant chamber.

In some embodiments, the heat collector may be a metal reflector having a parabolic or half-cylinder shape.

In some embodiments, an actuator may be coupled to the metal reflector. The actuator may be operable to move the metal reflector to a first position that concentrates the incident solar radiation on the desiccant chamber, and to a second position that substantially shields the desiccant chamber from the incident solar radiation. A controller may be coupled to the actuator, and may be configured to activate the actuator to move the metal reflector to the first position to heat the desiccant, and to move the metal reflector to the second position to cool the desiccant.

In some embodiments, the desiccant chamber may be a tubular enclosure that is external from the module enclosure, and may be pneumatically coupled to the internal air cavity of the module enclosure at a first end of the tubular enclosure.

In some embodiments, the breathable moisture barrier may be positioned at a second end of the tubular enclosure opposite the first end.

In some embodiments, the breathable moisture barrier may be a silicone membrane. In some embodiments, the breathable moisture barrier may be an expanded polytetrafluoroethylene ePTFE) membrane.

In some embodiments, the desiccant chamber may be pneumatically coupled to the internal air cavity of the module enclosure without a moisture barrier therebetween.

In some embodiments, the desiccant may be cooled sufficiently to maintain a dew point of the air inside the internal cavity below the temperature of the air inside the internal cavity during the temperature cycle in which the temperature of the internal cavity decreases.

In some embodiments, an equilibrium capacity of the desiccant may vary as a function of temperature over a temperature range of about 0° C. to about 60° C.

In some embodiments, the relative humidity of the air inside the internal cavity of the module enclosure may not exceed about 70% as a temperature of the ambient air decreases.

According to further embodiments of the present invention, a concentrator-type photovoltaic apparatus includes a light receiving module enclosure comprising an internal cavity including one or more photovoltaic cells therein, a desiccant within the internal cavity of the module enclosure including the one or more photovoltaic cells therein without a moisture barrier between the desiccant and the internal cavity, and a breathable moisture barrier configured to allow air exchange between the internal cavity and ambient air outside the module enclosure.

In some embodiments, the breathable moisture barrier may be sized to provide a water vapor transmission rate of about 30 mg/hour or less.

In some embodiments, the breathable moisture barrier may be an orifice in the module enclosure having a diameter of about 5.5 millimeters or less to achieve low water transmission rate and improve resistance against mechanical puncture.

In some embodiments, the desiccant may be thermally coupled to an internal surface of the module enclosure.

In some embodiments, the surface of the module enclosure may be a sidewall surface that does not include the one or more photovoltaic cells thereon, and the desiccant may be a plurality of desiccant beads distributed along the sidewall surface of the module enclosure.

In some embodiments, the surface of the module enclosure may be a backplane surface including the one or more photovoltaic cells thereon, and the desiccant may be a plurality of desiccant beads distributed along the upper half surface of the module enclosure adjacent the one or more photovoltaic cells.

In some embodiments, the water vapor transmission rate may be sufficient to maintain a dew point of the air inside the internal cavity below the temperature of the air inside the internal cavity during a temperature cycle in which a temperature of the ambient air decreases.

In some embodiments, a relative humidity of the air inside the internal cavity of the module enclosure may not exceed about 53% as the temperature of the ambient air decreases.

In some embodiments, the desiccant may be provided in a desiccant chamber that is pneumatically coupled in series between the breathable moisture barrier and the internal cavity by at least one diffusion channel. The diffusion channel may be a high-aspect ratio cavity. For example, a first diffusion channel may pneumatically couple the breathable moisture barrier to the desiccant chamber, and a second diffusion channel may pneumatically couple the desiccant chamber to the internal cavity. In some embodiments, at least one of the first and second diffusion channels may have a sinuous shape.

According to still further embodiments of the present invention, a method of reducing moisture in a concentrator-type photovoltaic module may include providing a desiccant in pneumatic communication with a module enclosure comprising an internal cavity including one or more photovoltaic cells therein without a moisture barrier between the desiccant and the internal cavity, providing a breathable moisture barrier to allow air exchange between the internal cavity and ambient air outside the module enclosure, and prolonging an adsorption phase of the desiccant for a duration sufficient to maintain a dew point of the air inside the internal cavity below the temperature of the air inside the internal cavity during a temperature cycle in which a temperature of the ambient air decreases.

In some embodiments, prolonging the adsorption phase of the desiccant may include providing the desiccant in a desiccant chamber that is pneumatically coupled in series between the breathable moisture barrier and the internal cavity of the module enclosure, and thermally decoupling the desiccant chamber from the module enclosure to provide a lag between a temperature of the desiccant chamber and a temperature of the internal cavity.

In some embodiments, prolonging the adsorption phase of the desiccant may include providing the desiccant within the internal cavity of the module enclosure including the one or more photovoltaic cells therein without the moisture barrier therebetween, and providing the breathable moisture barrier having a size of about 5.5 millimeters (mm) or less.

In some embodiments, prolonging the adsorption phase of the desiccant may include providing the desiccant in a desiccant chamber that is pneumatically coupled in series between the breathable moisture barrier and the internal cavity by at least one diffusion channel. The diffusion channel may be a high-aspect ratio cavity, and/or may have a sinuous shape in some embodiments.

Other devices and/or methods according to some embodiments will become apparent to one with skill in the art upon review of the following drawings and detailed description. It is intended that all such additional embodiments, in addition to any and all combinations of the above embodiments, be included within this description, be within the scope of the invention, and be protected by the accompanying claims.

BRIEF DESCRIPTION OF THE DRAWINGS

The above and other features and advantages of the present invention will become evident upon review of the following summarized and detailed descriptions in conjunction with the accompanying drawings.

DETAILED DESCRIPTION OF EMBODIMENTS

Figure 1:
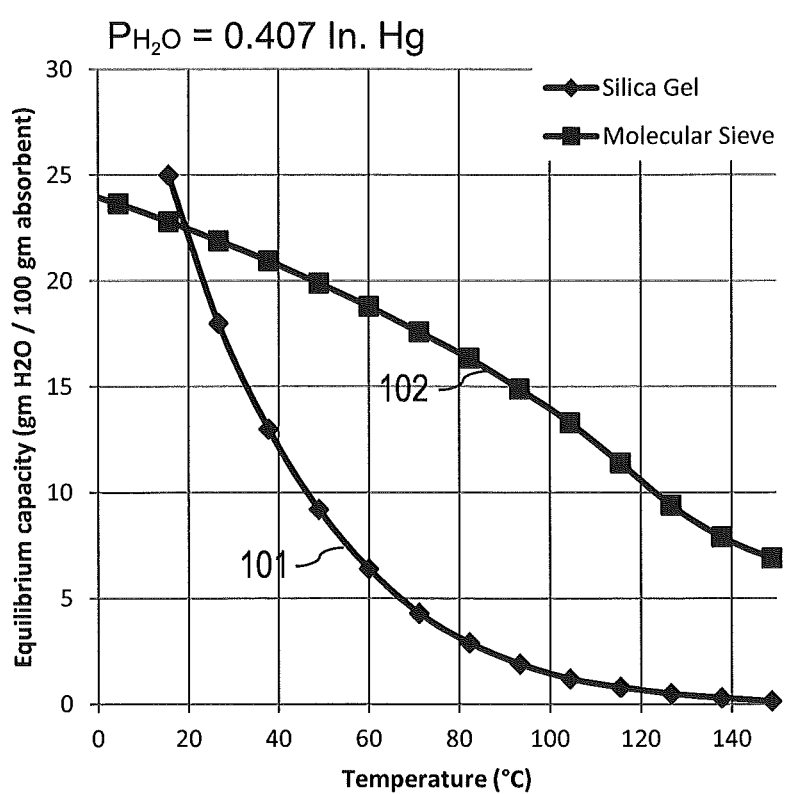
FIG. 1 is a graph illustrating the equilibrium capacity curve for desiccants used in embodiments of the present invention as a function of temperature.

Embodiments of the present invention address a long-standing need for a low cost solution for drying the air inside concentrator photovoltaic modules (CPVs) in order to reduce and/or prevent condensation of water vapor when the temperature of the module decreases below the dew point of the air located inside these modules. While existing solutions may rely on the use of desiccant cartridges, such systems typically require periodic field intervention in order to replace the desiccant, and thus, may (at best) partially meet the above needs. Also, experiments with traditional approaches and solutions have not lead to solutions that provide practical, inexpensive and long-term reliable condensation control in concentrator photovoltaic modules. For example, breathers with a membrane such as "Gore-Tex®" can be used to prevent liquid water from entering a properly sealed photovoltaic module; however such membranes do not prevent the exchange of water vapor. Thus, although such breathers may keep out liquid water and particles, if the humidity level is high enough during the day, condensation can form inside a module during cooler night time periods when the temperature of the module drops below the dew point.

Some embodiments of the present invention may arise from realization that, as the equilibrium capacity of a desiccant typically increases as the temperature is reduced, the adsorption phase of the desiccant can be prolonged (thereby increasing the duration for which the desiccant can store excess water molecules, and thus, the length of protection against condensation) by providing a lag or delay between the desiccant temperature and the temperature of the CPV module, and/or by impeding the flow of ambient air into the CPV module. In some embodiments, this may be accomplished by thermally decoupling the desiccant from the module enclosure, such that the desiccant can be cooled earlier than the air inside the enclosure to increase its capacity in advance of a condensation-inducing ambient temperature drop. In other embodiments, this may be accomplished by providing the desiccant within the module enclosure but reducing the size or diameter of a breathable interface between the air inside the module enclosure and the ambient air, thereby reducing the ingress rate of moisture. Embodiments of the present invention may use a desiccant material having a large variation of equilibrium capacity as a function of temperature, specifically in the 0° C. to 40-60° C. temperature range (e.g., the temperature range typically experienced inside a CPV module exposed to direct sunlight) in order to obtain high absorption capacity around freezing, and low absorption capacity when the desiccant is partially regenerated. Accordingly, embodiments of the present invention provide methods, systems, and devices that use a desiccant or other moisture buffer to reduce the rate of ingress of moisture into the module enclosure, thereby maintaining the dew point of the air inside the enclosure below the temperature of the air inside the enclosure for a greater duration of time during the various temperature cycles experienced by the module.

Embodiments of the present invention provide a low-cost solution for condensation and moisture control, which may be of benefit in light of the inherent nature of the long life-cycle expected from costly solar arrays and solar farms. Embodiments of the present invention may also be capable of continuous operation in outdoor environments, for a service period of up to 25 years or more. Embodiments of the present invention may also operate reliably and autonomously, with few or minimal maintenance requirements. Also, each module or small group of modules may be equipped with an independent (i.e., not centralized) condensation solution in order to ensure adequate resistance to possible or eventual leakage of one module or tubing connections between an array of modules. Thus, embodiments of the present invention can provide a cost-effective solution that requires little or no field maintenance and utilizes heat generated from the electronics to address control of condensation and condensation inside CPV modules.

In particular embodiments, in order to prevent condensation, desiccant beads can be placed inside a heater tube or other enclosure to dehumidify the air entering the module. FIG. 1 is a graph illustrating the equilibrium capacity curve for several classes or types of desiccant beads as a function of temperature. As shown in FIG. 1, the equilibrium capacity of a silica gel desiccant and a molecular sieve desiccant typically increases as the temperature is reduced, as shown by lines 101 and 102, respectively. Thus, the air inside the modules may be actively dried by increasing the temperature of the desiccant beads relative to the temperature of the module when the module is heating up (expelling air to the ambient) and decreasing the temperature of the desiccant beads relative to the temperature of the module when the module is cooling down (accepting ambient air). Several criteria were considered in developing embodiments of the present invention and improving system drying efficiency, including the following parameters (a non-exhaustive list): mass of the desiccant beads, aspect ratio of the heater tube, variation of the desiccant equilibrium capacity, temperature ramp down/ramp up rate, air flow passing through the heater tube as a function of the volume of the internal cavities of the module, vapor transmission rate through the breathers, relative humidity of the ambient air, initial equilibrium desiccant capacity (prior to cooling down), initial relative humidity of the air inside the module, and ingress of water vapor through the module seal (which may be virtually negligible, as the vapor transmission rate of standard silicones is typically order of magnitudes lower than the vapor transmission rate of "Gore-Tex®" type breathers).

Addressing the above heat and mass transfer problems may involve finding solutions to a set of coupled differential equations. Numerical models have been developed for calculating the evolution of moisture content inside desiccant packed-bed systems when these systems are subject to transient variation of temperature, as described, for example, in J. Sun et al., International Journal of Heat and Mass Transfer 48 (2005), p. 4953-4962. In these semi-empirical models, the moisture adsorption capacity of the desiccant beads is usually derived through curve fitting of experimental data. Accurate modeling of the constantly evolving thermal convective flow of the air enclosed inside a photovoltaic module, which is subject to rapid changes of sun light irradiance, wind speed, and ambient temperature, presents a challenging modeling problem. A special laboratory experimental setup was thus developed in order to validate some operational principles of embodiments described herein, as discussed below with reference to FIG. 2A.

Figure 2A:
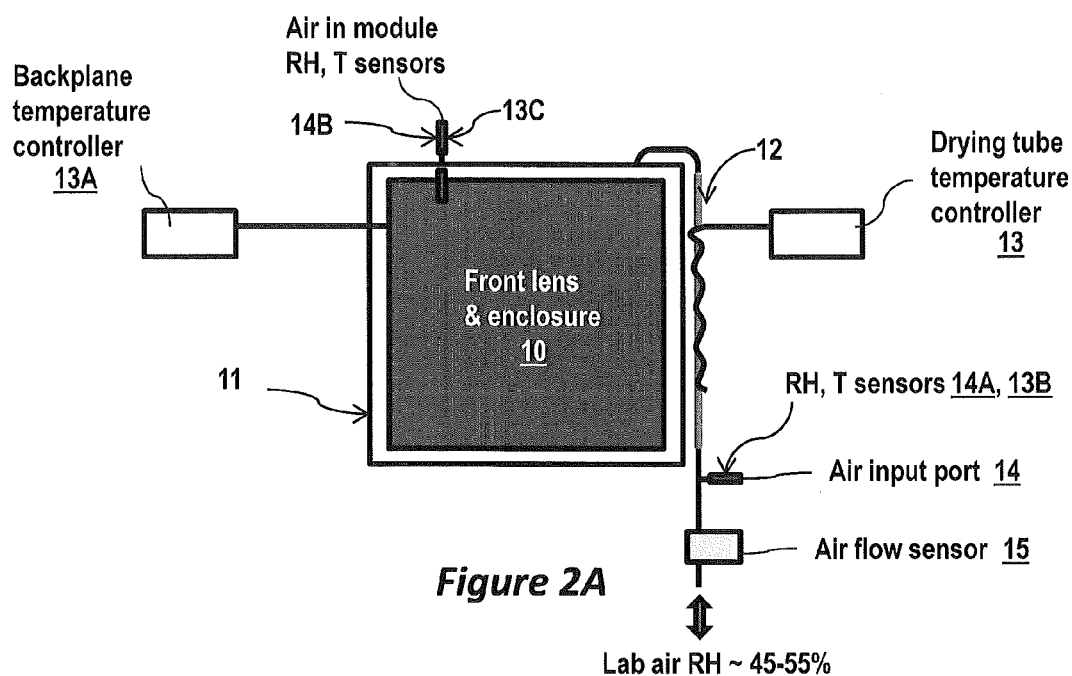
FIG. 2A is a schematic illustration of an experimental setup for evaluating the performance of a regenerative desiccant drying tube that is pneumatically coupled to a photovoltaic module enclosure in accordance with some embodiments of the present invention.

FIG. 2A presents an experimental setup which was used to characterize the drying efficiency of an example drying tube that was studied in a laboratory under controlled conditions. This experimental setup includes a module enclosure 10 equipped with silicone blanket heaters 11 to simulate the heat energy which would be dissipated by the photovoltaic module enclosure 10 when exposed to direct sun light, and a drying tube heater 12 including desiccant beads therein pneumatically coupled to the module enclosure 10. In one experiment, the drying tube heater was filled with silica gel desiccant beads. The experiment setup was equipped with various temperature sensors 13, 13A, 13B and 13C, relative humidity sensors 14A and 14B, and an air flow sensor 15. The module enclosure silicone blanket heaters 11 were independently software controlled in order to study the performance of the system when these heaters 11 were thermo-cycled between room temperature (about 25 degrees Celsius) and a regeneration temperature of about 60 degrees Celsius.

Figure 2B:
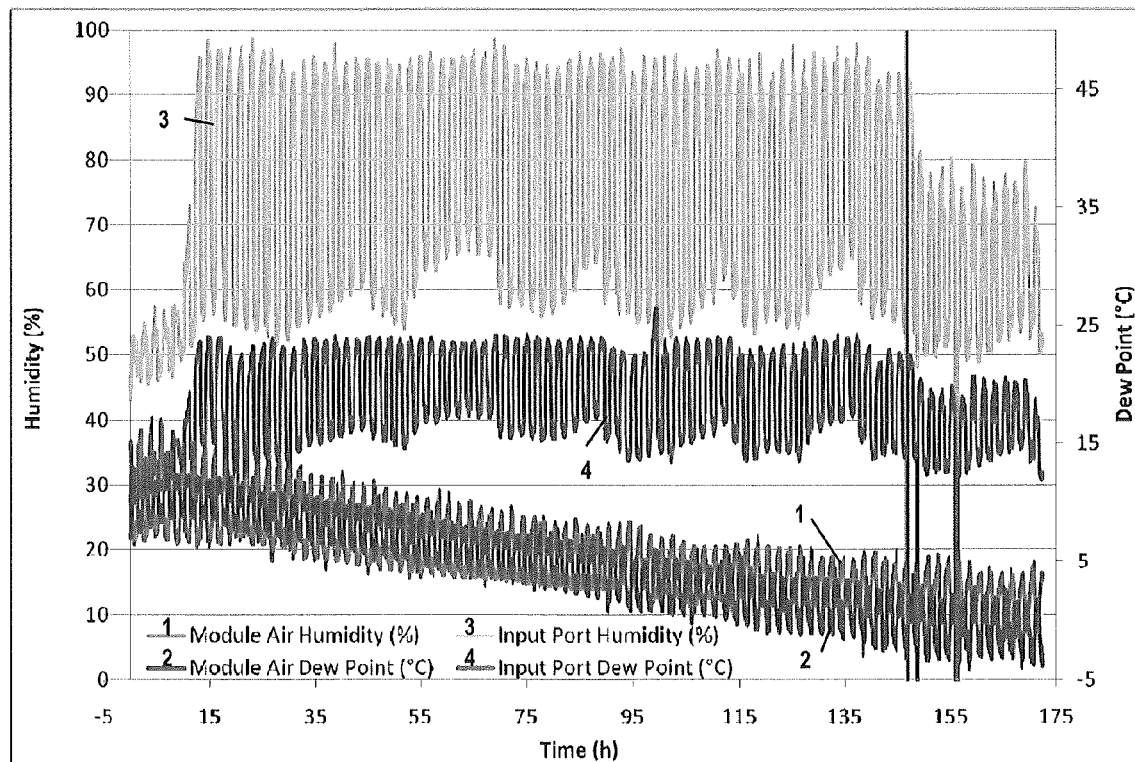
FIG. 2B is a graph illustrating experimental results from using the setup presented in FIG. 2A in accordance with some embodiments of the present invention.

FIG. 2B presents some experimental results illustrating the humidity levels 1 and 3 measured within the module enclosure 10 and at the air input port 14, respectively, as well as the dew points 2 and 4 measured within the module enclosure 10 and at the air input port 14, respectively. The results shown in FIG. 2B demonstrate that the relative humidity (and dew point) of the air located inside the module of FIG. 2A can be successfully reduced when the drying tube heating is turned on before the module enclosure heater (e.g., such that the desiccant within the drying tube is heated earlier than the air inside the module enclosure), and turned off before the module enclosure heater (e.g., such that the desiccant within the drying tube is cooled earlier than the air inside the module enclosure). In other words, embodiments of the present invention introduce a lag between the desiccant temperature and the module temperature, to break the symmetry between desiccant desorption (during heating) and adsorption (during cooling) phases. Positive time delays of 2 or 10 minutes between the turn-on/turn-off times of the drying tube heaters 12 and turn-on/turn-off times of the module enclosure heaters 11 yielded similar results. The system drying efficiency was estimated by extracting the module's inside air dew point decrease rate per temperature cycle. In this experiment, a dew point reduction rate of about 0.2 degree Celsius per cycle was observed.

Figure 3:
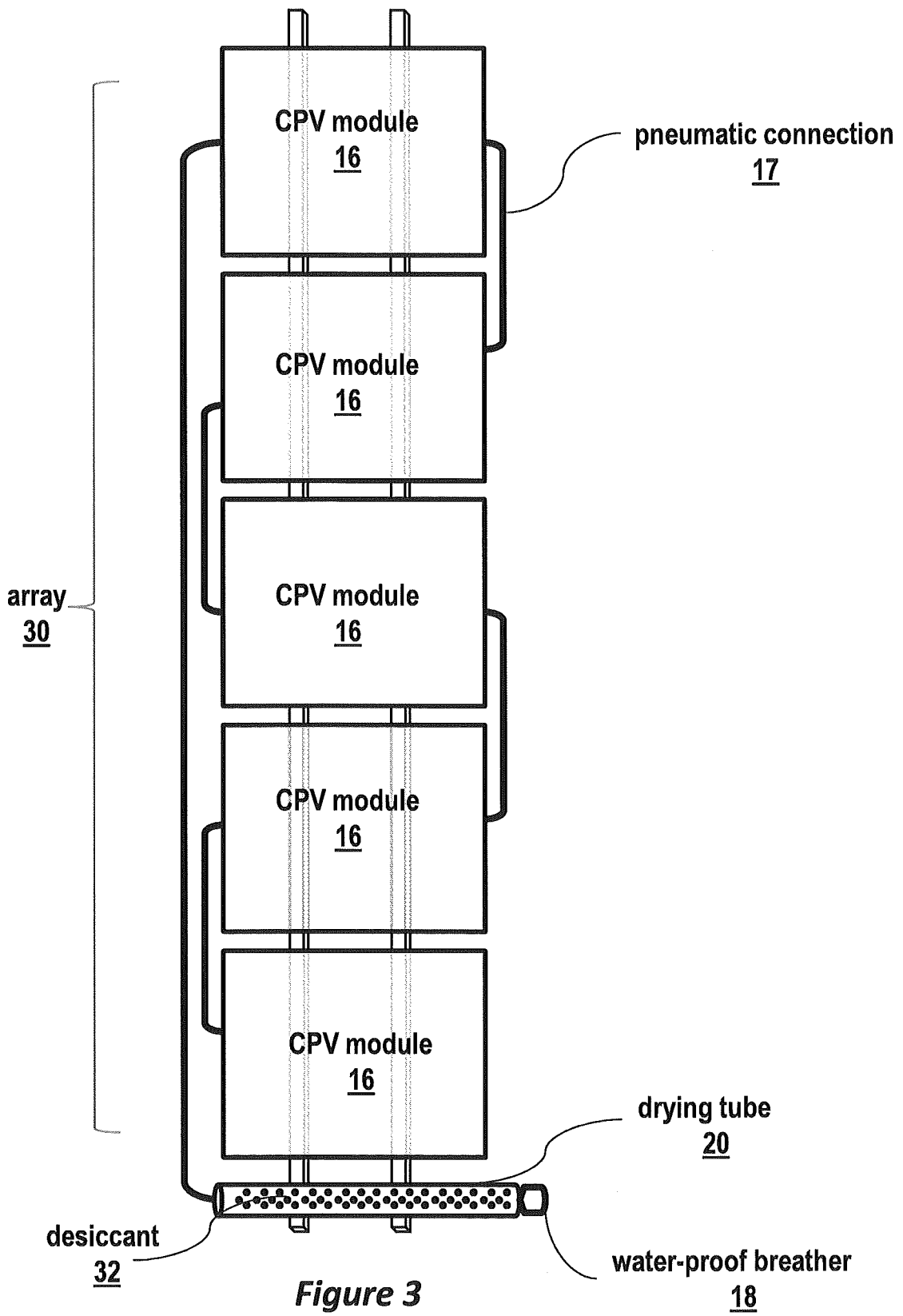
FIG. 3 is a schematic illustration of an array of 5 photovoltaic modules that are pneumatically coupled to a regenerative desiccant drying tube terminated with a water-proof breather in accordance with some embodiments of the present invention.

FIG. 3 presents an implementation of the above system in accordance with some embodiments of the present invention to protect a small array 30 of CPV modules 16 (an array of five (5) modules in this example) from condensation. Each CPV module 16 is sealed and pneumatically coupled 17 in a series or parallel to a common drying tube 20, which includes a desiccant (illustrated as desiccant beads 32) therein. The drying tube 20 is pneumatically coupled between at least one of the modules 16 and a breathable moisture barrier, also referred to herein as a water-proof breather 18. The array 30 of modules 16 are typically mounted onto a two axis solar tracker (not shown) which actively orients the modules 16 to receive sun light at normal incidence. In the case of the deployment of an array of trackers, the drying tubes 20 can be mounted under each array 30 of modules 16 in order to avoid casting additional shadows on other trackers. Placing the drying tube 20 under the array 30 of modules 16 (e.g. at the bottom of the tracker frame) can improve the system efficiency as the shadows casted by other trackers in the field are traveling from bottom to top when the sun sets, which provides a way for the drying tube 20 (and the desiccant 32 therein) to cool down earlier than the array 30 of photovoltaic modules 16, also referred to herein as a positive time delay between the cooling of the drying tube 20 and the cooling of the modules 16. The opposite may be true when the sun rises in the sky (i.e., the modules 16 receive sun light earlier in the day than the drying tube 20). However, this negative time delay has little impact on the system drying performance, as the photovoltaic modules 16 typically continue to slowly heat during the course of a sunny day. As direct, normal incidence flux increases as the sun rises in the sky, the air located inside the modules 16 continues to expand and exhausts the moisture released by the desiccant beads 32.

Figure 4A:
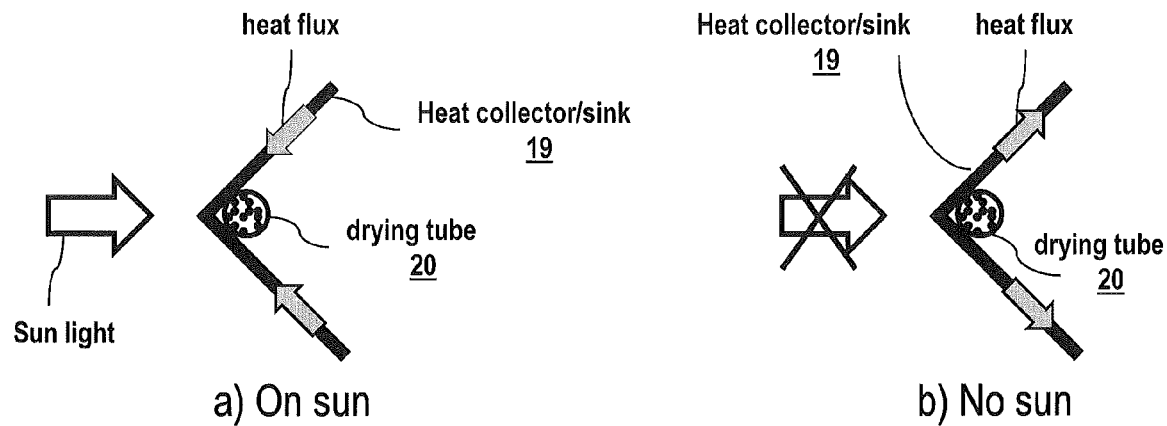
FIG. 4A is a schematic illustration of a regenerative desiccant drying tube that is thermally coupled to a heat collector/sink in accordance with some embodiments of the present invention.
Figure 4B:
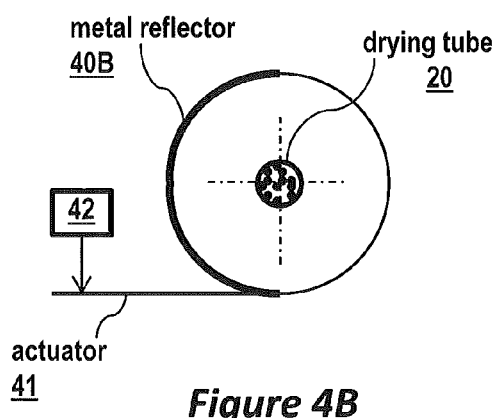
FIG. 4B is a schematic illustration of a regenerative desiccant drying tube relying on the use of an actuated cylindrical metal reflector in accordance with some embodiments of the present invention. The actuator is configured to alternatively concentrate sun light or cast shadow on the drying tube during different times of the day.
Figure 4C:
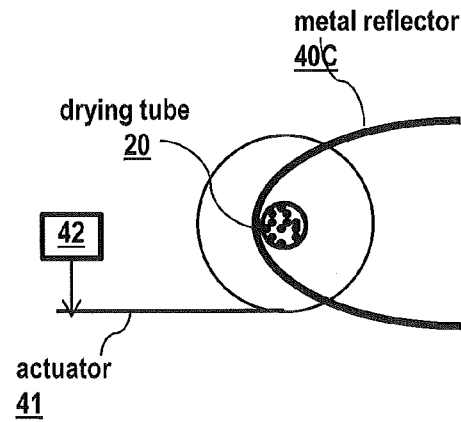
FIG. 4C is a schematic illustration of a regenerative desiccant drying tube relying on the use of an actuated parabolic metal reflector in accordance with further embodiments of the present invention. The actuator is configured to alternatively concentrate sun light or cast shadow on the drying tube during different times of the day. The metal reflector may be thermally coupled to the drying tube in some embodiments.

FIGS. 4A to 4C present various example embodiments of the invention using different heat collector designs. FIG. 4A presents an embodiment in which a solar heat collector 19, illustrated as an extruded right angle metal profile, is thermally coupled to a drying tube 20 filled with desiccant beads 32. The surface of the heat collector 19 is treated with a black coating in order to increase or maximize absorption of sun light. During daytime, the heat collector 19 absorbs sun light which provides a way for heating the drying tube 20 (and the desiccant 32 therein) earlier and/or more quickly (e.g., at a higher heating rate) than the CPV modules, also referred to herein as a positive time delay between the heating of the drying tube 20 and the heating of the CPV modules. Conversely, when the sun sets, the heat collector 19 provides a way for dissipating the heat accumulated in the drying tube 20 during the course of a day earlier and/or more quickly (e.g., at a higher cooling rate) than the CPV modules.

FIG. 4B is a schematic illustration of an alternative embodiment for heating and cooling a regenerative desiccant drying tube 20, which relies on the use of an actuated cylindrical metal reflector 40B. An actuator 41 is operable to alternatively move the metal reflector 40B to a first position that concentrates sun light on the drying tube 20, or to a second position that casts a shadow on or otherwise substantially shields the drying tube 20 from sun light during different times of the day, responsive to signals from a controller module 42.

FIG. 4C is a schematic illustration of an alternative embodiment of a regenerative desiccant drying tube 20, which relies on the use of an actuated parabolic metal reflector 40C. The actuator 41 is operable to alternatively move the metal reflector 40C to a first position that concentrates sun light or to a second position that casts a shadow on the drying tube 20 during different times of the day, responsive to signals from a controller module 42. The metal reflector 40B or 40C can physically coupled to the drying tube 20 in some embodiments.

Reducing or minimizing the thermal mass and increasing or maximizing the surface area of the heat collector 19 can insure that the desiccant beads 32 are cooling faster than the air inside the module(s) 16, thus creating the positive time delay. This positive time delay allows for at least partial restoration of the absorption capacity of the desiccant 32, which allows for drying the ambient air entering the system when the module(s) 16 are cooling down at sunset. The regenerative drying tube 20 thus acts as a buffer to store water molecules, and as a moisture pump. The combination of these two functions provides a way for actively drying the air inside the module(s) 16. Experimental data collected in the field confirmed that the solutions in accordance with some embodiments of the present invention described above can successfully reduce and even prevent condensation of water inside photovoltaic modules 16 during the temperature cycles experienced by the modules 16 over the course of a day.

Figure 5A:
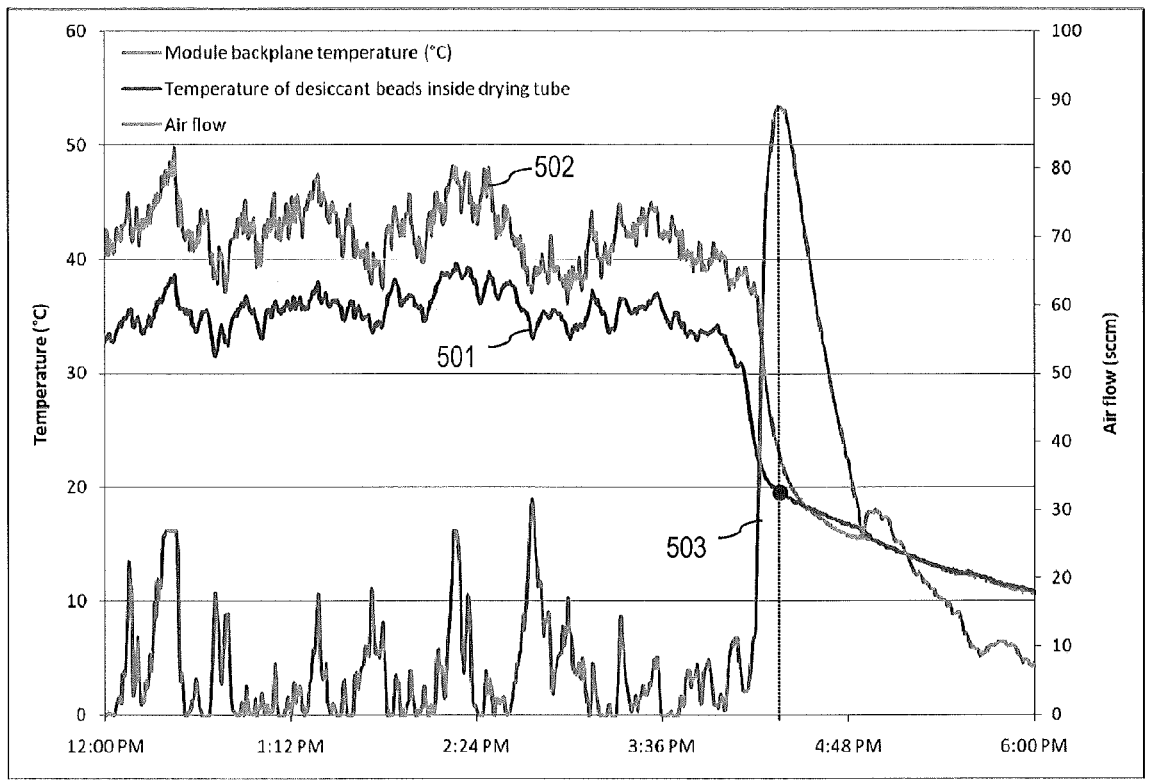
FIG. 5A is a graph illustrating experimental results acquired using an array of 3 modules pneumatically connected to a regenerative desiccant drying tube in accordance with some embodiments of the present invention as illustrated in FIG. 4A. The figure presents temperature measurements of one of the module enclosures, the temperature of the desiccant beads inside the drying tube, and the flow of air entering or exhausted by the array of modules through the drying tube during the course of an afternoon.

FIG. 5A presents some field results acquired on an array of 3 photovoltaic modules that were pneumatically interconnected with plastic tubing to a drying tube in a manner similar to that illustrated in FIG. 3. In this field test, a 3 foot long by ½ inch diameter stainless steel drying tube was bonded to a heat collector having an extruded aluminum profile using a thermally conducting adhesive. The drying tube was filled with silica gel beads as a desiccant. An air flow sensor was used to monitor the flow of air entering and exhausted from the module array. The test results confirmed that when the sun sets, the temperature of the desiccant beads (shown by line 501) is decreased earlier than the temperature of the module enclosure (shown by line 502), thus permitting a temporary increase of the desiccant absorption capacity. Partial recovery of some of the desiccant capacity provides a way for drying the ambient air entering the module as the air temperature inside the module enclosure decreases at sunset (or during cloudy periods), which reduces the temperature of the air inside the module and thus increases the flow of ambient air into the module (shown by line 503) due to the drop in air pressure. FIG. 5A demonstrates that the desiccant beads can be partially re-generated at greater than about 35° C. during sun exposure, and cooled down to less than about 20° C. when ambient air flows back into the module array.

Figure 5B:
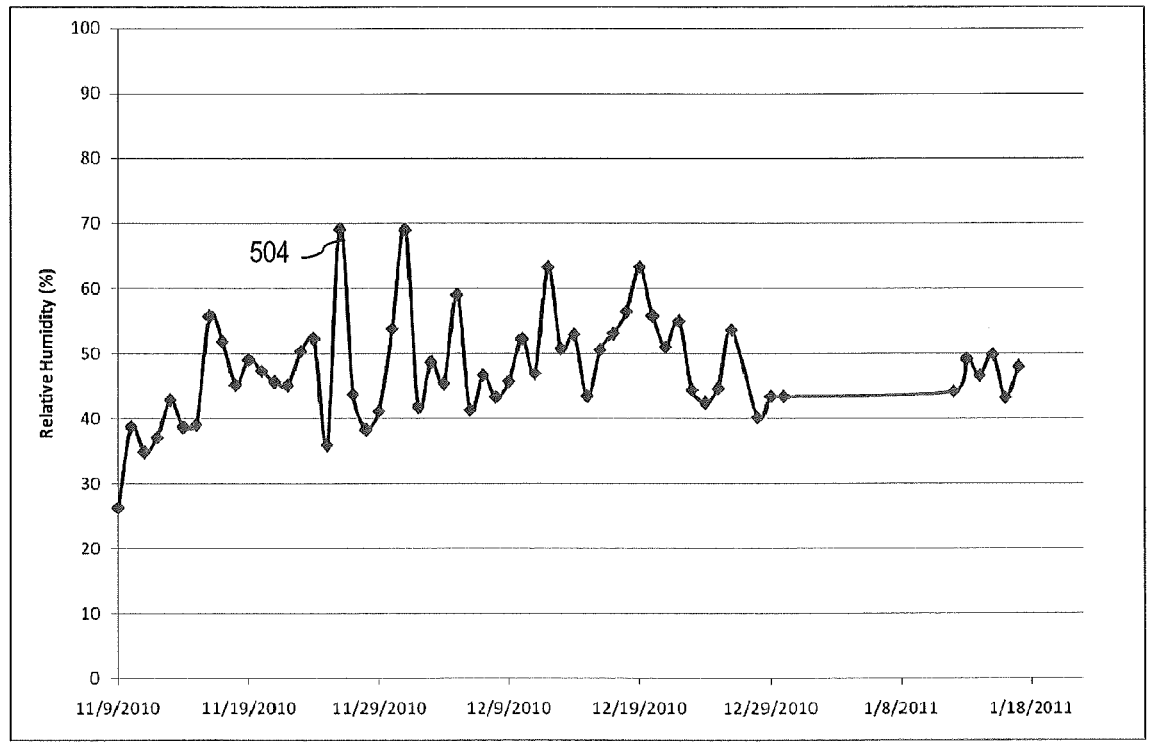
FIG. 5B is a graph illustrating experimental results acquired on an array of 3 modules pneumatically connected to a regenerative desiccant drying tube in accordance with some embodiments of the present invention as illustrated in FIG. 4A. The figure presents measurements of the relative humidity inside one of the modules acquired at midnight during winter months.

FIG. 5B presents measurements of the relative humidity of the air inside one of the modules acquired at midnight, from Nov. to Jan. The relative humidity inside the modules (shown by line 504) did not rise above 70%, confirming the efficiency of the condensation solutions according to some embodiments of the present invention described herein. In contrast, several condensation events occurred in reference modules which were equipped with only a waterproof breather (e.g., without a drying tube including desiccant beads therein).

Figure 6:
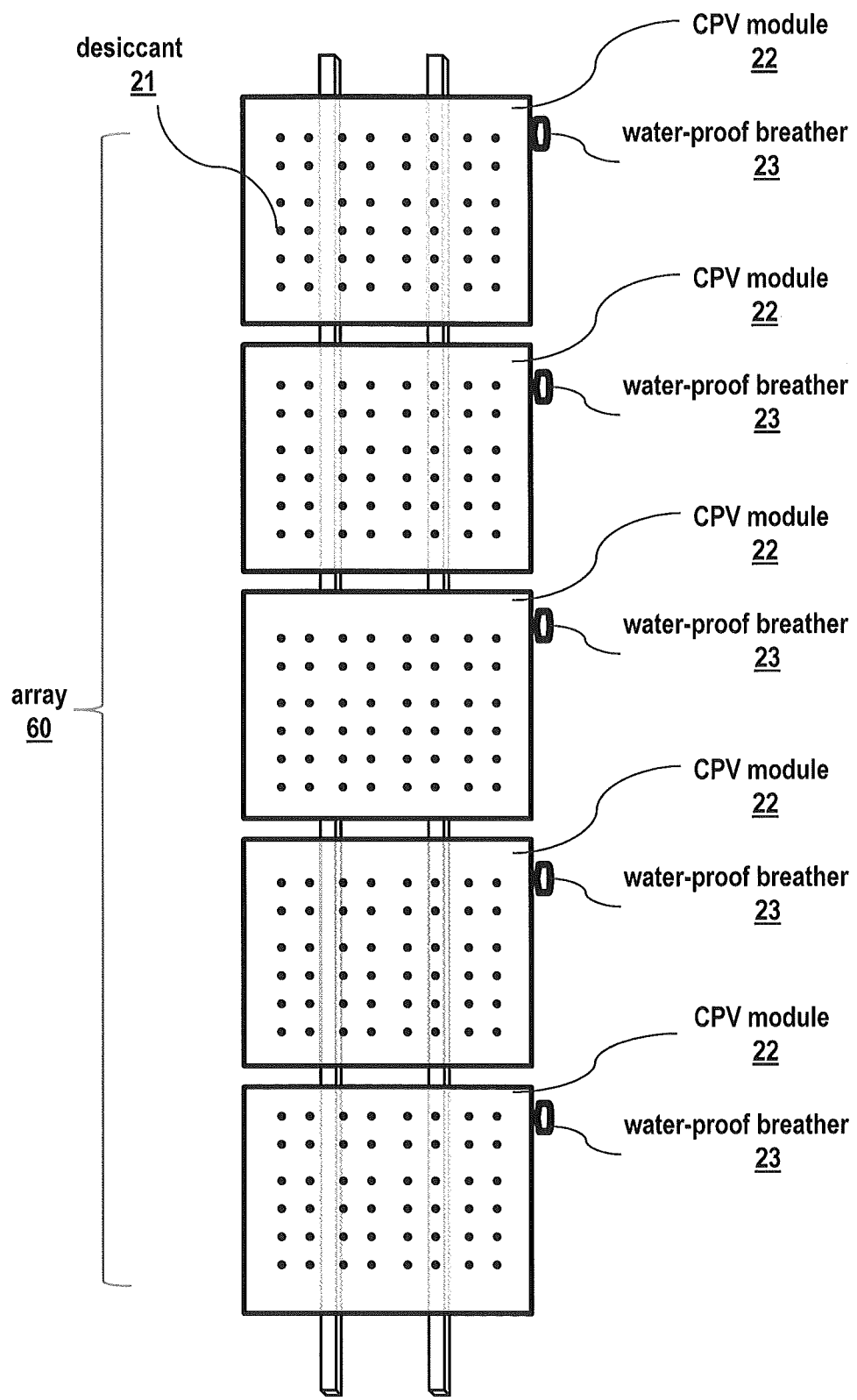
FIG. 6 is a schematic illustration of an array of photovoltaic modules that are equipped with water-proof breathers and regenerative desiccant beads, which are thermally coupled to each module enclosure, in accordance with some embodiments of the present invention.

FIG. 6 presents further embodiments of the invention in which an array 40 of sealed CPV modules 22 are protected from condensation by desiccant beads 21 located within the internal cavity of each CPV module 22. Each module 22 is also equipped with a water-proof breathable membrane 23 that allows air exchange between the internal cavity and ambient air outside the module 22. In this embodiment, the desiccant beads 21 absorb excess water molecules when the ambient air temperature decreases (for example, at sunset or under cloudy conditions). Under equilibrium conditions, the relative humidity of the air inside the module 22 is equal to the average relative humidity of the ambient air. Under these conditions, the desiccant capacity is equal to its equilibrium capacity at a given temperature (FIG. 1). During a temporary temperature drop of the ambient temperature, the capacity of the desiccant 21 increases. If the mass of desiccant 21 present inside the module 22 is sufficient to provide enough capacity to absorb excess water molecules, then a condensation event can be temporarily avoided as long as the dew point of the air inside the module 22 remains lower than the module temperature. If the ambient air temperature remains low during an extended period, then the capacity of the desiccant beads 21 will eventually be fully consumed as water molecules will permeate through the module breather 23. It was thus discovered that, contrary to the vent manufacturer's recommendations of 12.5 millimeter (mm) diameter vents for the test module size, vents having a diameter of about 5.5 mm instead could be used to reduce or minimize the area of the breathers 23, in order to further reduce water vapor ingress rate and thus increase or maximize the length of this temporary protection against condensation.

When the ambient air temperature increases or when the module 22 is exposed to sun light, the module 22 warms up, which thus induces an increase of the pressure of the air located inside the module 22. Also, as the module enclosure warms up, the capacity of the desiccant beads 21 therein is reduced, and thus the desiccant beads 21 release moisture into the module 22. This moisture is thereby evacuated to the ambient through the module breather 23 during subsequent temperature cycles until equilibrium conditions are reached again. In such an embodiment of the invention, the desiccant beads 23 are placed on a surface of the module enclosure (for example, on a backplane surface adjacent one or more of the photovoltaic cells or on a sidewall surface) in order to increase or maximize the temperature at which the desiccant beads 21 are regenerated during direct on sun exposure. Thus, the heating of the module 22 during normal operation provides a way for partially regenerating the desiccant beads 21. The desiccant beads 21 thus provide temporary protection against condensation events.

Figure 7:
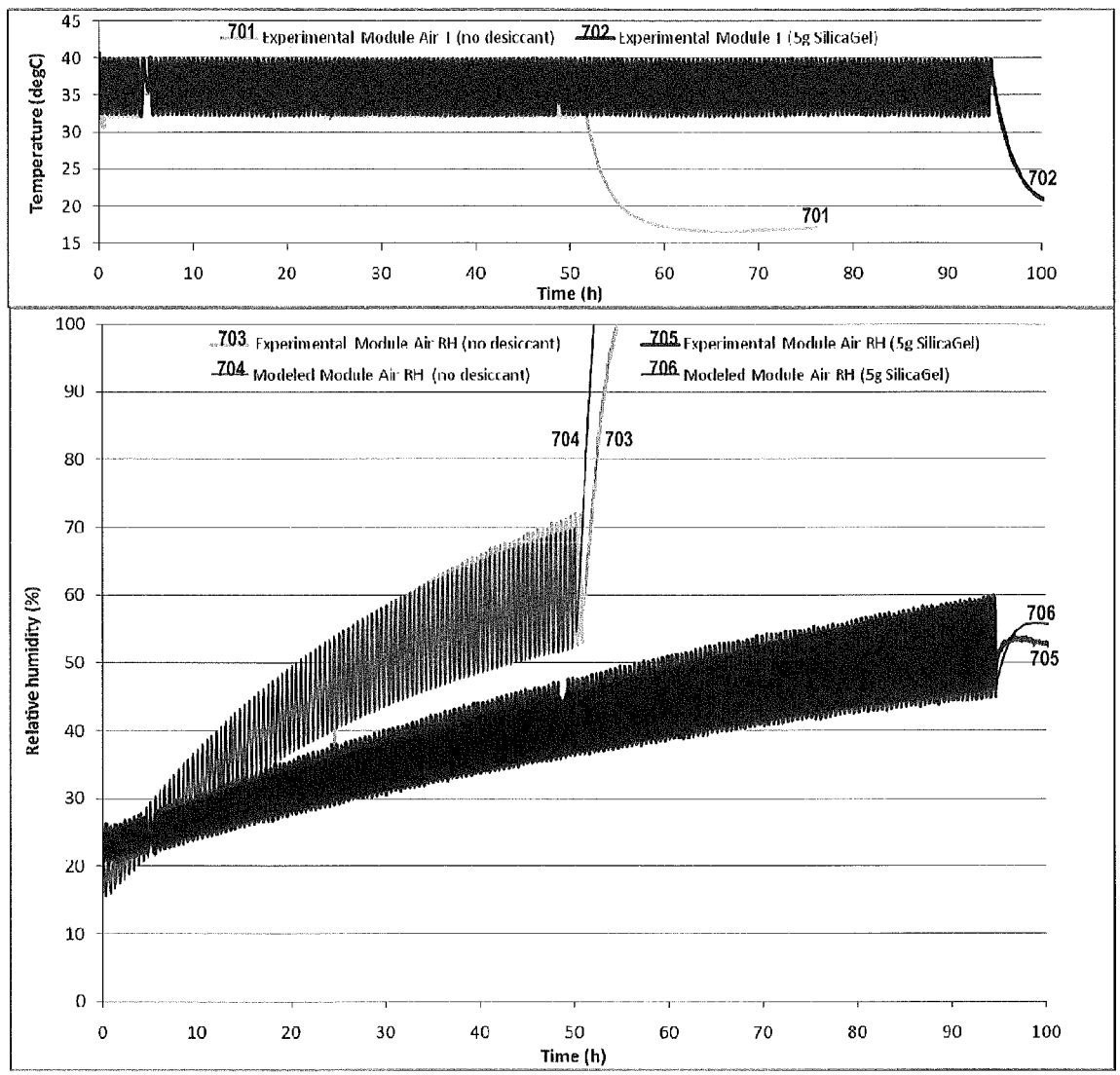
FIG. 7 is a graph illustrating experimentally measured and modeled evolution of the air relative humidity in a photovoltaic module equipped with a water-proof breather in accordance with some embodiments of the present invention. These results compare the evolution of the air moisture content inside a module equipped with desiccant beads in accordance with some embodiments of the present invention with the same module equipped with no desiccant beads.

FIG. 7 presents some test data on the evolution of the air moisture content inside a photovoltaic module equipped with a water-proof breather. The module under test includes a powder coated steel metal enclosure having an internal air cavity of 0.6×0.44×0.06 m. The front side of the enclosure includes a glass plate sealed to the metal enclosure with a 10 mm wide silicone bead. Two thermocouples and two calibrated capacitive type relative humidity sensors were used to monitor the evolution of the air temperature and relative humidity in the chamber and inside the module. The damp heat chamber was programmed to perform three successive temperature profiles. During a first phase, the relative humidity of the chamber was set to a constant 80% set point and the temperature was set to 40 degrees centigrade. During a second phase, the chamber was programmed to regulate the air relative humidity to a fixed 80% set point and to cycle temperature between 30 and 40 degrees centigrade with a 30 minute cycle time. Finally, during a third phase, the chamber was programmed to continue to regulate relative humidity to a constant 80% set point and the temperature controller was turned off. During this last phase, the temperature of the air in the chamber dropped and equilibrated toward the room ambient temperature.

Two experiments were conducted on a module to verify the efficiency of the here disclosed condensation solution relying on the use of regenerating desiccant beads. First an empty module (i.e. with no desiccant beads) was placed inside the damp heat chamber. After a brief transient phase, the temperature and relative humidity of the module air reached a quasi-steady state at respectively 40 C and 16% relative humidity, as shown by lines 701, 703, and 704. During the second phase, a small amount of air was forced in and out of the module—through the breather—as the temperature of the chamber was cycled between 30° C. and 40° C. In this phase, the relative humidity of the air inside the module followed an asymptotic increase toward an equilibrium value equal to the chamber set point (80%). After 100 temperature cycles, the module air relative humidity value reached an average value of approximately 60%, as shown by lines 703 (experimental) and 704 (modeled). After turning off the chamber temperature controller for the third phase, the temperature of the module exponentially decreased toward ambient room temperature, as shown by line 701. Water quickly condensed inside the module as the cooler air no longer had enough capacity to hold the moisture accumulated inside the module.

This experiment was then repeated after adding 5 g of white silica gel desiccant beads inside the module. During the second phase, the relative humidity of the air inside the module followed a slower asymptotic increase with an approximately 3 times longer time constant, as shown by line 705. This effective reduction of the moisture ingress rate case can be explained using a theoretical model based on conservation of mass molecule and equation of state (as shown by line 706 in FIG. 7). In other words, the silica gel beads act as a buffer in which water is temporarily stored during the cool down phases and retrieved during ramp up phases of the temperature cycles. During the cool down phases, less water molecules are saturating the module air (as a portion of these molecules are stored in the desiccant beads) and during the ramp up phases, more water molecules are evacuated from the module as the desiccant beads are releasing moisture. The result achieved is an overall reduction of the average ingress rate of moisture into the module. Finally, the damp heat chamber temperature controller was turned off after 190 temperature cycles when the module air relative humidity reached approximately 50%. During this third phase of the test, the relative humidity of the air located inside the module remained almost constant as shown by line 705. This result can also be explained with this first order theoretical model, as illustrated in FIG. 7 by line 706.

Accordingly, as the capacity of the desiccant beads increases when the temperature of the module is dropping, with proper selection of the desiccant type and a large enough mass of beads placed inside the module, condensation events can be successfully prevented as excess water molecules are (temporarily) stored in the desiccant. The desiccant beads can be attached to the module enclosure to increase or maximize regeneration of the desiccant capacity when the module is exposed to direct sun light. Although discussed with reference to silica gel and molecular sieve desiccants, it will be understood that other desiccants may also be used in embodiments of the present invention described herein. More generally, the invention relies on the use of a desiccant material having a large variation of equilibrium capacity as a function of temperature, specifically in the 0° C. to 40-60° C. temperature range, in order to obtain high absorption capacity around freezing and low absorption capacity when the desiccant is partially regenerated, in a temperature range typically experienced inside a concentrator photovoltaic module exposed to direct sun light.

Figure 8:
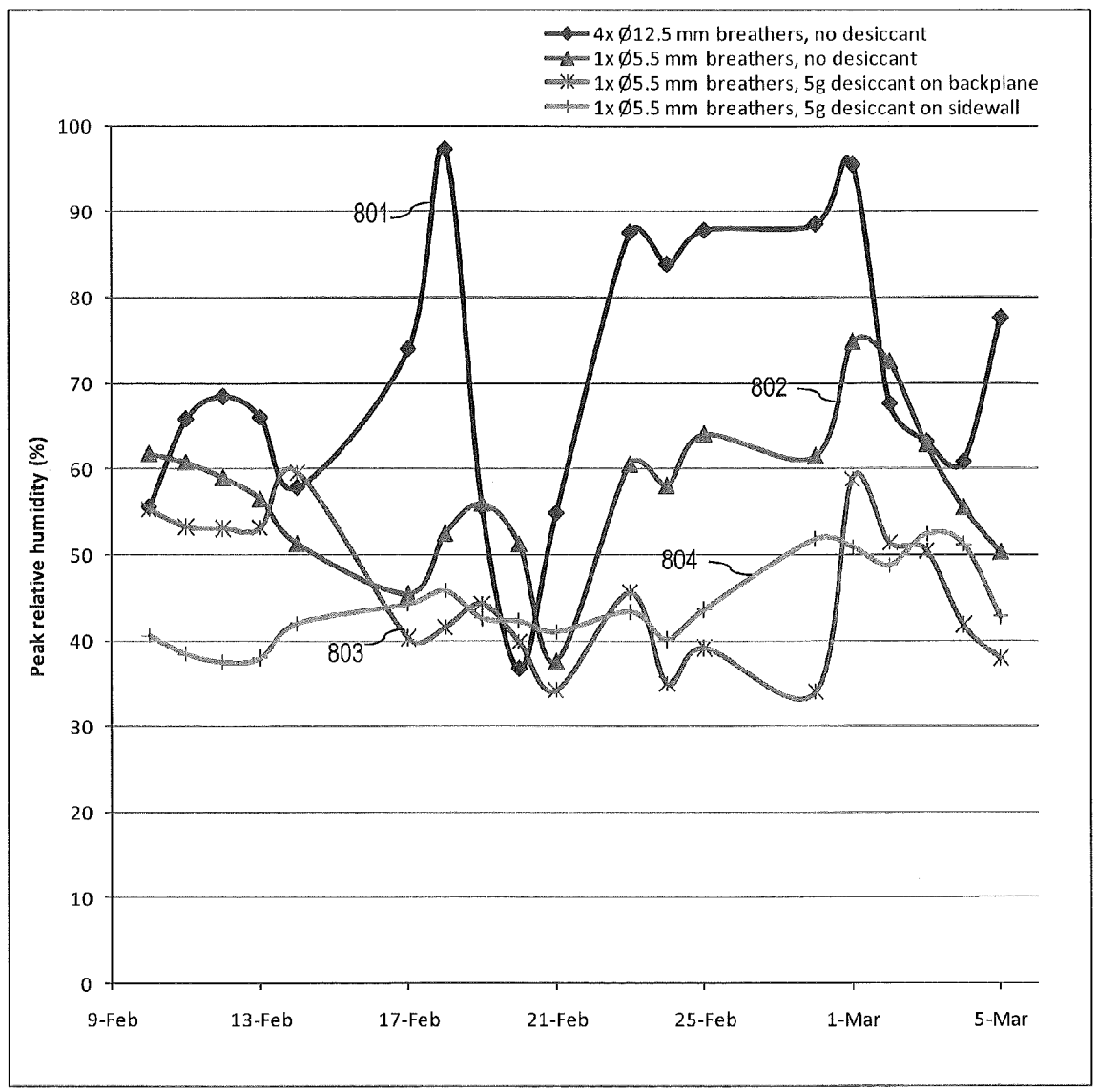
FIG. 8 is a graph illustrating experimental results acquired in the field on 4 modules equipped with different breathers in accordance with some embodiments of the present invention. Silica gel desiccant beads were placed inside two of the modules to protect these modules against condensation events. The plot shows the daily peak relative humidity of the air inside the module. Relative humidity data was recorded at one minute sampling intervals.

FIG. 8 presents some test data recorded in the field which confirms the ability of the embodiments described herein to protect concentrator photovoltaic modules against condensation events. The FIG. 8 plot shows the daily peak relative humidity of the air located inside 4 different concentrator photovoltaic modules. Each module's air relative humidity data was recorded using a capacitive type relative humidity sensor placed inside each module enclosure. The sensors were shaded from direct sun light in order to ensure accurate measurements. Test data was collected on 4 modules respectively including a 3 mm thick glass plate sealed (with a silicon bead) to a powder coated steel enclosure (440×600×65 mm in size). The inner surface of the enclosure was painted with black paint in order to simulate the presence of an array of photovoltaic receivers which would absorb sun light. Each module enclosure was equipped with one of the following configurations: i) 4 breathers (e.g., breathable moisture barriers) of 12.5 mm inner diameter and no desiccant inside the modules (shown by line 801); ii) one breather of 5.5 mm inner diameter and no desiccant inside module (shown by line 802); iii) one breather of 5.5 mm inner diameter and 5 g of white silica gel beads attached to the center section of the module enclosure using a silicone adhesive (shown by line 803); and iv) one breather of 5.5 mm inner diameter, packet containing 5 g of white silica gel beads attached to the surface of the module's lower vertical sidewall using a silicone adhesive (shown by line 804).

In the case i) of the first module equipped with relatively large breathers of 12.5 mm, water condensed inside the module at several occasions. Condensed water droplets mostly formed on the surface of the module front glass, which is typically the coldest part of the module.

In the case ii) of the second module equipped with a smaller breather of 5.5 mm, no condensation events were visually noticeable during the course of the field test.

In the case iii) of the third module including a 5.5 mm breather with the desiccant beads on the backplane, the relative humidity of the air inside the module was successfully buffered by the desiccant beads, which resulted in lower peak and average humidity values. However, few condensation events were visually noticeable during cold sunny and windy days. During these cold sunny and windy days, the center section of the module enclosure (which was exposed to direct sun light) was significantly hotter than the module front glass, resulting in a large temperature gradient inside the module. The desiccant beads thereby released more water molecules during on-sun exposure, and the colder air behind the module front glass did not have enough capacity to hold this extra moisture. Thus, water molecules temporarily condensed on the inner surface of the module front glass.

Finally, in the case iv) of the fourth module, no condensation events were noticed. The desiccant beads successfully buffered the relative humidity of the air located inside the module and never exceeded 53% during the course of this field test. The average relative humidity was 35% which compares favorably with the 44% average relative humidity for case ii) (without desiccant).

Figure 9:
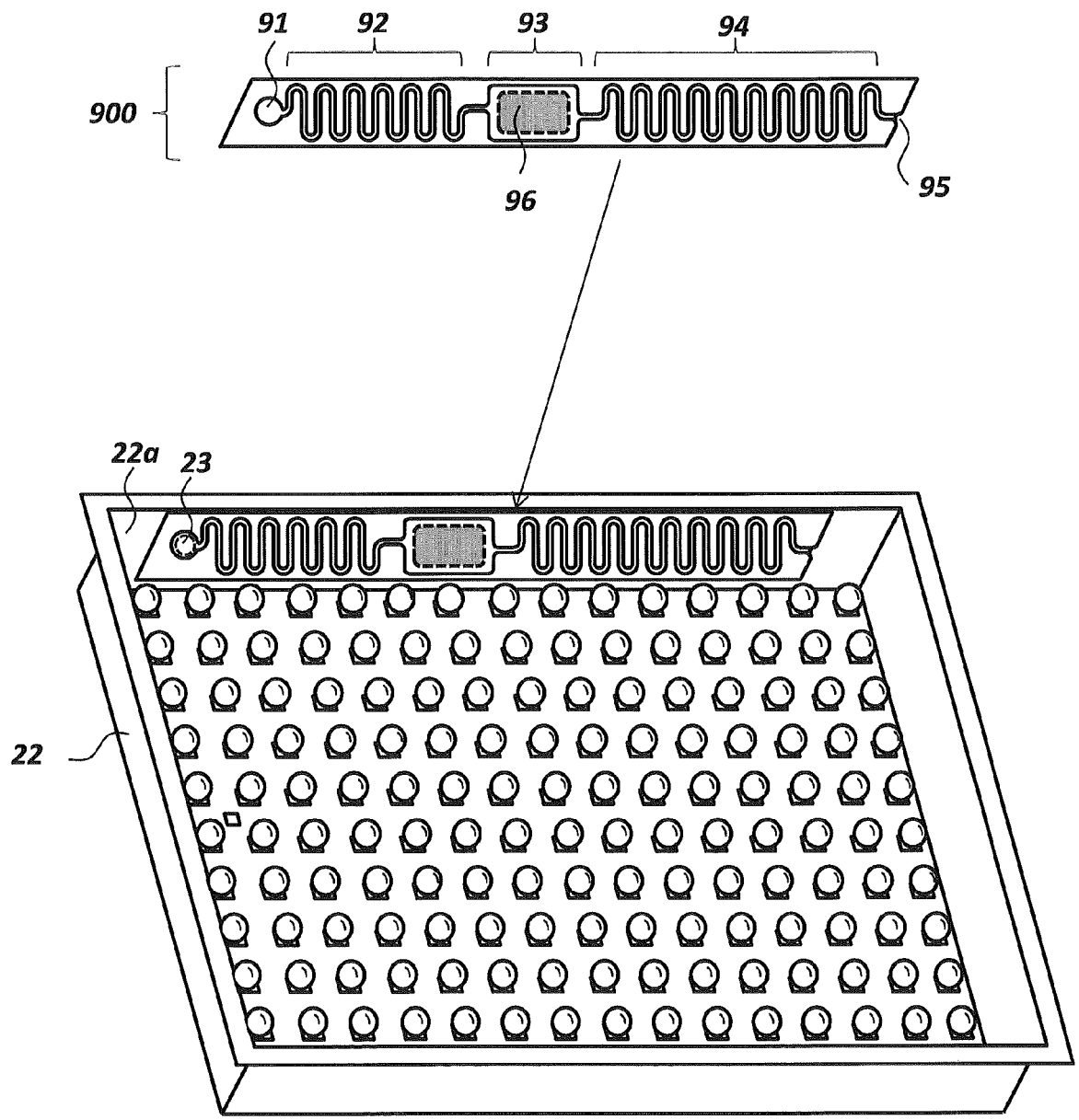
FIG. 9 is a schematic illustration of a photovoltaic module equipped with a water-proof breather and a desiccant packet located between two diffusion channels in accordance with some embodiments of the present invention.

FIG. 9 presents further embodiments of the invention in which a CPV module 22 is protected from condensation by a desiccant packet 96 located between two diffusion channels. As discussed herein, a diffusion channel refers to a high aspect ratio cavity (such as the interior volume of an elongated tube) having at least one geometrical dimension at least an order of magnitude larger than the shortest dimension of the cavity. In an embodiment of the invention, a first diffusion channel 92 provides a path for the air to circulate between a first orifice 91 connected to the module breather 23 and a cavity 93 containing a desiccant packet 96. A second diffusion channel 94 provides a path for the air to circulate between the cavity 93 containing the desiccant packet 96 and an open orifice 95 connected to the internal cavity of the CPV module 22. The desiccant packet is thermally connected to the inner surface 22a of the module enclosure, providing a mean for regenerating the desiccant packet 96 when the module enclosure is heated upon exposure to direct sunlight. The two diffusion channels effectively reduce water ingress rate and thus further extend the duration of the temporary protection against condensation provided by the herein disclosed invention. In addition, the diffusion channels force all the air volume entering or exiting the module 22 to pass through the desiccant packet 96. This embodiment of the invention further improves the ability of the desiccant 96 to effectively store water molecules in a more confined volume during the cool down phases of the module 22. When the ambient air temperature increases or when the module 22 is exposed to sun light, the module 22 warms up, which induces an increase of the pressure of the air located inside the module 22. As the module enclosure warms up, the capacity of the desiccant 95 therein is reduced, and thus the desiccant packet 96 releases moisture into the cavity 93. The air flowing through the second diffusion channel 94 mixes with the moister air located inside the sealed cavity 93 and pass through the first diffusion channel 92 before exiting the enclosure through the module breather 23. When the module temperature decreases, the ambient air entering the module 22 (through the breather 23) flows through the first diffusion channel 92. As the enclosure and thus desiccant temperature drop, the absorption capacity of the desiccant packet 95 increases. The air entering the module is thus partially dried as it flows near the desiccant in the cavity 93. In FIG. 9, the diffusion channels 92 and 94 are illustrated as having sinuous or serpentine shape; however, it will be understood that embodiments of the present invention are not limited to such shapes, and that the diffusion channels 92 and/or 94 may have other shapes that provide similar effects.

In a particular embodiment, the two diffusion channels 92 and 94 and the cavity 93 containing the desiccant packet 96 may be manufactured using a low cost sheet metal stamping operation resulting in the formation of a continuous metal plate 900 comprising embossed features. The embossed metal plate 900 may be attached to the inner surface 22a of the module enclosure 22, for example, with double sided pressure sensitive tape adhesive.

The differentiating factors discovered and described above (which enable efficient condensation control, low cost implementation, repeat reliability and virtually no maintenance requirements) in accordance with embodiments of the present invention can include: a waterproof breather membrane regulating the pressure of the air located inside the photovoltaic device enclosure, regenerative desiccant beads in dryer tubes or thermally coupled to one of the inner surfaces of the photovoltaic device enclosure, breather vents having a smaller diameter or cross-sectional area, and/or positive time delays of 2 to 10 minutes between heating/cooling of the desiccant dryer tube and heating/cooling of the module enclosure.

The present invention has been described herein with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. It will also be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention.

The terminology used in the description of the invention herein is for the purpose of describing particular embodiments only and is not intended to be limiting of the invention. As used in the description of the invention and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms used in disclosing embodiments of the invention, including technical and scientific terms, have the same meaning as commonly understood by one of ordinary skill in the art to which this invention belongs, and are not necessarily limited to the specific definitions known at the time of the present invention being described. Accordingly, these terms can include equivalent terms that are created after such time. It will be further understood that terms, such as those defined in commonly used dictionaries, should be interpreted as having a meaning that is consistent with their meaning in the present specification and in the context of the relevant art and will not be interpreted in an idealized or overly formal sense unless expressly so defined herein. All publications, patent applications, patents, and other references mentioned herein are incorporated by reference in their entireties.

As used herein, the term "concentrated photovoltaic" may refer to a system that concentrates electromagnetic radiation from the sun (e.g., "sunlight") to a spot (with irradiance greater than 1000 W/m$^2$ in some embodiments) and generates electrical power from the resulting concentrated electromagnetic radiation. Also, the term "solar cell" may refer to a photovoltaic device that is used under the illumination of sunlight to produce electrical power. Solar cells contain semiconductors with a band-gap and at least one p-n junction. Typical compositions of a solar cell may include silicon, germanium, or compound semiconductors such as gallium arsenide (GaAs), aluminum-gallium arsenide (AlGaAs), indium-gallium arsenide (InGaAs), aluminum-gallium-indium-arsenide (AlInGaAs), gallium-indium phosphide (GaInP), aluminum-indium phosphide (AlInP), aluminum-gallium-indium phosphide (AlGaInP), and combinations there-of. The term "micro-solar cell" may refer to a solar cell having a total surface area smaller than 1 mm$^2$. "Receiver" may refer to a group of one or more solar cells and secondary optics that accepts concentrated sunlight and incorporates means for thermal and electric energy transfer. "Module" may refer to an enclosure including a group of receivers, optics, and other related components therein, such as interconnection and mounting that accepts sunlight. Also, the term "hermetic seal" is used herein to refer to a seal which, for practical purposes, is considered airtight. In electronics, a hermetic seal may be used with reference to sealed enclosures of electronic parts that are designed and intended to secure against the entry of water vapor and foreign bodies in order to maintain the proper functioning and reliability of their contents. In contrast, a "sealed" enclosure may or may not be considered airtight.

Many different embodiments have been disclosed herein, in connection with the above description and the drawings. It will be understood that it would be unduly repetitious and obfuscating to literally describe and illustrate every combination and subcombination of these embodiments. Accordingly, the present specification, including the drawings, shall be construed to constitute a complete written description of all combinations and subcombinations of the embodiments described herein, and of the manner and process of making and using them, and shall support claims to any such combination or subcombination.

In the drawings and specification, there have been disclosed embodiments of the disclosure and, although specific terms are employed, they are used in a generic and descriptive sense only and not for purposes of limitation, the scope of the disclosure being set forth in the following claims.

That which is claimed:

1. A concentrator-type photovoltaic apparatus, comprising:
   a light receiving module enclosure comprising an internal cavity including one or more photovoltaic cells therein;
   a breathable moisture barrier configured to allow air exchange between the internal cavity and ambient air outside the module enclosure; and
   a desiccant chamber including a desiccant therein pneumatically coupled between the breathable moisture barrier and the internal cavity, wherein the desiccant chamber is thermally decoupled from the module enclosure such that a temperature of the internal cavity lags a temperature of the desiccant chamber.

2. The apparatus of claim 1, wherein the desiccant chamber and the module enclosure are positioned such that the desiccant within the desiccant chamber is cooled prior to air inside the internal cavity of the module enclosure during a temperature cycle in which the temperature of the internal cavity decreases.

3. The apparatus of claim 2, wherein the desiccant chamber is positioned under the module enclosure when mounted on a solar tracker.

4. The apparatus of claim 2, wherein the desiccant chamber and the module enclosure are positioned such that the desiccant within the desiccant chamber is heated prior to the air inside the internal cavity of the module enclosure during a temperature cycle in which the temperature of the internal cavity increases.

5. The apparatus of claim 4, further comprising:
   a heat collector thermally coupled to the desiccant chamber,
   wherein the heat collector is configured absorb or concentrate incident solar radiation on the desiccant chamber to heat the desiccant at a higher rate than the air inside the internal cavity of the module enclosure during the temperature cycle in which the temperature of the internal cavity increases,
   and wherein the heat collector is configured to dissipate heat accumulated in the desiccant chamber to cool the desiccant at a higher rate than the air inside the internal cavity of the module enclosure during the temperature cycle in which the temperature of the internal cavity decreases.

6. The apparatus of claim 5, wherein the heat collector physically contacts the desiccant chamber.

7. The apparatus of claim 5, wherein the heat collector comprises a metal reflector having a parabolic or half-cylinder shape.

8. The apparatus of claim 5, further comprising:
an actuator coupled to the metal reflector, wherein the actuator is operable to move the metal reflector to a first position that concentrates the incident solar radiation on the desiccant chamber, and to a second position that shields the desiccant chamber from the incident solar radiation; and
a controller coupled to the actuator, wherein the controller is configured to activate the actuator to move the metal reflector to the first position to heat the desiccant, and to move the metal reflector to the second position to cool the desiccant.

9. The apparatus of claim 1, wherein the desiccant chamber comprises a tubular enclosure that is external from the module enclosure, and wherein the desiccant chamber is pneumatically coupled to the internal air cavity of the module enclosure at a first end of the tubular enclosure.

10. The apparatus of claim 9, wherein the breathable moisture barrier is positioned at a second end of the tubular enclosure opposite the first end.

11. The apparatus of claim 10, wherein the breathable moisture barrier comprises an expanded polytetrafluoroethylene membrane.

12. The apparatus of claim 1, wherein the desiccant chamber is pneumatically coupled to the internal air cavity of the module enclosure without a moisture barrier therebetween.

13. The apparatus of claim 2, wherein the desiccant is cooled sufficiently to maintain a dew point of the air inside the internal cavity below the temperature of the air inside the internal cavity during the temperature cycle in which the temperature of the internal cavity decreases.

14. The apparatus of claim 13, wherein an equilibrium capacity of the desiccant increases when temperature decreases over a temperature range of about 0° C. to about 60° C.

15. The apparatus of claim 13, wherein a relative humidity of the air inside the internal cavity of the module enclosure does not exceed about 70% as a temperature of the ambient air decreases.

16. A concentrator-type photovoltaic apparatus, comprising:
a light receiving module enclosure comprising an internal cavity including one or more photovoltaic cells therein;
a desiccant within the internal cavity of the module enclosure including the one or more photovoltaic cells therein without a moisture barrier between the desiccant and the internal cavity; and
a breathable moisture barrier configured to allow air exchange between the internal cavity and ambient air outside the module enclosure.

17. The apparatus of claim 16, wherein the breathable moisture barrier is sized to provide a water vapor transmission rate of about 30 mg/h or less.

18. The apparatus of claim 17, wherein the breathable moisture barrier comprises an orifice in the module enclosure having a diameter of about 5.5 millimeters or less.

19. The apparatus of claim 18, wherein the breathable moisture barrier comprises an expanded polytetrafluoroethylene membrane in the orifice.

20. The apparatus of claim 16, wherein the desiccant is thermally coupled to an internal surface of the module enclosure.

21. The apparatus of claim 20, wherein the surface of the module enclosure comprises a sidewall surface that does not include the one or more photovoltaic cells thereon, and wherein the desiccant comprises a plurality of desiccant beads distributed along the sidewall surface of the module enclosure.

22. The apparatus of claim 20, wherein the surface of the module enclosure includes the one or more photovoltaic cells thereon, and wherein the desiccant comprises a plurality of desiccant beads distributed along the surface of the upper half section of the module enclosure adjacent the one or more photovoltaic cells.

23. The apparatus of claim 17, wherein the water vapor transmission rate is sufficient to maintain a dew point of the air inside the internal cavity below the temperature of the air inside the internal cavity during a temperature cycle in which a temperature of the ambient air decreases.

24. The apparatus of claim 23, wherein a relative humidity of the air inside the internal cavity of the module enclosure does not exceed about 53% as the temperature of the ambient air decreases.

25. The apparatus of claim 16, wherein the desiccant is provided in a desiccant chamber that is pneumatically coupled in series between the breathable moisture barrier and the internal cavity by at least one diffusion channel comprising a high-aspect ratio cavity.

26. The apparatus of claim 25, wherein the diffusion channel comprises a first diffusion channel pneumatically coupling the breathable moisture barrier to the desiccant chamber and a second diffusion channel pneumatically coupling the desiccant chamber to the internal cavity, wherein at least one of the first and second diffusion channels has a sinuous shape.

* * * * *